United States Patent [19]
Kohno

[11] Patent Number: 5,303,188
[45] Date of Patent: Apr. 12, 1994

[54] SEMICONDUCTOR MEMORY DEVICE REGULABLE IN ACCESS TIME AFTER FABRICATION THEREOF

[75] Inventor: Takaki Kohno, Tokyo, Japan
[73] Assignee: NEC Corporation, Tokyo, Japan
[21] Appl. No.: 52,664
[22] Filed: Apr. 27, 1993
[30] Foreign Application Priority Data
  Apr. 28, 1992 [JP] Japan .................. 4-136231
[51] Int. Cl.$^5$ .................. G11C 7/00; G11C 11/40
[52] U.S. Cl. .................. 365/189.05; 365/189.01; 365/230.08; 307/443
[58] Field of Search .................. 365/189.05, 189.01, 365/230.08; 307/279, 451, 452, 443

[56] References Cited
U.S. PATENT DOCUMENTS

| | | | |
|---|---|---|---|
| 4,928,265 | 5/1990 | Higuchi et al. | 365/189.05 X |
| 4,985,644 | 1/1991 | Okihara et al. | 365/189.05 X |
| 5,073,872 | 12/1991 | Masuda et al. | 365/189.05 |
| 5,151,621 | 9/1992 | Goto | 307/443 |
| 5,245,573 | 9/1993 | Nakaora | 365/189.05 |

FOREIGN PATENT DOCUMENTS
0096889 4/1989 Japan ................ 365/230.8

Primary Examiner—Eugene R. LaRoche
Assistant Examiner—Son Dinh
Attorney, Agent, or Firm—Sughrue, Mion, Zinn, Macpeak & Seas

[57] ABSTRACT

An electrically programmable read only memory device stores data bits each in the form of either high or low threshold level of a memory cell, and an accessed data bit is transferred from a selected memory cell to an output data buffer unit for delivery to a destination, wherein a plurality of output data buffer circuits are provided in the output data buffer unit and are selectively used for the data delivery depending upon current driving capability expected by a customer.

4 Claims, 10 Drawing Sheets

SEMICONDUCTOR MEMORY DEVICE REGULABLE IN ACCESS TIME AFTER FABRICATION THEREOF

FIELD OF THE INVENTION

This invention relates to a semiconductor memory device and, more particularly, to a semiconductor memory device regulable in access time after the fabrication thereof.

DESCRIPTION OF THE RELATED ART

Referring first to FIG. 1, a typical example of a semiconductor memory device is fabricated on a semiconductor chip 1, and the semiconductor memory device is of an electrically programmable read only memory. The prior art electrically programmable read only memory device largely comprises a memory cell array 2, an addressing system 3, a data transferring system 4 and a data write-in system 5. Although other systems such as a power distribution system are incorporated in the electrically programmable read only memory device, they are deleted from FIG. 1 for the sake of simplicity.

The memory cell array 2 is implemented by a plurality of non-volatile memory cells arranged in rows and columns, and each of the non-volatile memory cells are accessible with a row address and a column address. Each of the non-volatile volatile memory cells is implemented by a floating gate type field effect transistor, and comprises source and drain regions 2a and 2b spaced from each other, a lower gate oxide film 2c over a channel region between the source and drain regions 2a and 2b, a floating gate electrode 2d on the lower gate oxide film 2c, an upper gate oxide film 2e on the floating gate electrode 2d and a control gate electrode 2f on the upper gate oxide film 2e. An inter-level insulting film 2g covers the floating gate type field effect transistor. If the drain region 2b is reversely biased with respect to the semiconductor chip 1, hot electrons are produced at the p-n junction therebetween, and the control gate electrode 2f positively biased attracts the electrons for accumulating in the floating gate electrode 2d. The accumulated electrons elevate the threshold level of the floating gate type field effect transistor. The accumulated electrons are evacuated from the floating gate electrode 2d in the presence of ultra-violet radiation, and the threshold is recovered from the relatively high level to the original low level. Thus, each of the non-volatile memory cells has either high or low threshold level, and the high and low threshold levels are corresponding to data bits of the two logic levels.

Turning back to FIG. 1, the addressing system 3 comprises an address buffer unit 3a, a row address decoder/ word line driver unit 3b, a column address decoder unit 3c and a column selector unit 3d. The address buffer unit 3a is coupled with address pins ADD, and row address bits indicative of a row address and column address bits indicative of the column address are transferred from the address pins ADD and to address buffer unit 3a. The address buffer unit 3a predecodes the row and column address bits, and supplies the row address bits and the complementary row address bits to the row address decoder/ word line driver unit 3b and the column address bits and the complementary column address bits to the column address decoder unit 3c. The row address decoder/ word line driver unit 3b recognizes the row address, and drives one of the word lines WL1 to WLm coupled with the control gate electrodes 2f in the row of non-volatile memory cells assigned the row address. The selected word line is driven to an intermediate voltage level such as 5 volts between the high and low threshold levels. While the word line is 3b, the selected non-volatile memory cells selectively produce conductive channels between digit lines DL1 to DLn and a constant voltage line (not shown) depending upon the threshold levels thereof. As will be described hereinbelow, current is supplied to one of the digit lines DL1 to DLn, and a selected non-volatile memory cell keeps the voltage level on the selected digit line constant or varies the voltage level by discharging the current.

On the other hand, the column address decoder unit 3c selectively drives decoded signal lines 3e, and controls the column selector unit 3d. Namely, the column selector unit 3d is responsive to the decoded signal lines 3e, and supplies the current to one of the digit lines DL1 to DLn coupled with the column of non-volatile memory cells assigned the column address.

The data transferring system 4 comprises a sense amplifier circuit 4a, an output data buffer unit 4b and a control signal buffer circuit 4c, and produces an output data signal through discrimination of the threshold level of the selected non-volatile memory cell. Namely, the sense amplifier circuit 4a supplies the current through the column selector unit 3d to the selected digit line, and monitors the voltage level on the selected digit line. If the selected non-volatile memory cell cuts off the current, the voltage level on the associated digit line is relatively high. However, if the selected non-volatile memory cell discharges the current to the constant voltage line, the voltage level is decayed, and is, accordingly, relatively low The sense amplifier circuit 4a discriminates the voltage level propagated from the selected digit line thereto, and produces the output data signal. The output data signal is supplied to the output data buffer unit 4b, and the output data buffer unit 4b in turn supplies the output data signal to a destination in the presence of an output enable signal OE supplied from the control signal buffer circuit 4c.

The data write-in system 5 comprises a write-in data buffer circuit 5a and a write-in circuit 5b, and a write-in data bit indicative of either high or low threshold level is supplied from an input data pin Din through the write-in data buffer circuit 5a to the write-in circuit 5b. If the write-in data bit is indicative of the low threshold level, the write-in circuit 5b does not supply write-in voltage level to a selected non-volatile memory cell, and no electron is produced at the p-n junction. Therefore, any electron is not accumulated in the floating gate electrode, and the selected non-volatile memory cell keeps the relatively low threshold However, if the write-in data bit is indicative of the high threshold level, the write-in circuit 5b supplies the write-in voltage level at 12.5 volts through the column selector unit to the selected digit line, and the word line driver causes the control gate electrode of the selected non-volatile memory cell to go up to the high voltage level. The write-in voltage level produces the hot electrons, and the control gate electrode 2f causes the floating gate electrode 2d to accumulate the hot electrons. A programmer sequentially changes the row and column address bits, and instructs the write-in circuit 5b to selectively apply the write-in voltage.

Turning to FIG. 3 of the drawings, the output data buffer unit 4b comprises a NAND gate 4d, a NOR gate 4e and a series combination of a p-channel enhancement type switching transistor 4f and an n-channel enhancement type switching transistor 4g coupled between a positive power voltage line Vcc and a ground voltage line. The output enable signal OE and the complementary signal thereof are supplied to the NAND gate 4a and the NOR gate 4e, and simultaneously enable the NAND gate 4d and the NOR gate 4e so as to make the gates 4d and 4e responsive to the output data signal. The output node of the NAND gate 4d is coupled with the gate electrode of the p-channel enhancement type switching transistor 4f, and the output node of the NOR gate 4e is coupled with the gate electrode of the n-channel enhancement type switching transistor 4g. While being enabled with the output enable signal OE and the complementary signal thereof, the NAND gate 4d and the NOR gate 4e serve as inverters, and complementarily switch the p-channel enhancement type switching transistor 4f and the n-channel enhancement type switching transistor 4g. If the output data signal is logic "1" level corresponding to high voltage level, the NAND gate 4d allows the p-channel enhancement type switching transistor 4f to turn on, leaving the n-channel enhancement type switching transistor 4g off. As a result, the p-channel enhancement type switching transistor 4f drives a capacitive load coupled with the output data pin Dout. On the other hand, if the output data signal is logic "0" level corresponding to low voltage level, the NOR gate allows the n-channel enhancement type switching transistor 4g to turn on, leaving the p-channel enhancement type switching transistor 4f off. As a result, the n-channel enhancement type switching transistor 4g discharge electric charges accumulated in the capacitive load.

Thus, the output data buffer unit 4b drives the capacitive load, and the current driving capability of the output data buffer unit 4b affects the access time or delay time between application of the row and column address bits and the determination of the logic level at the output data pin Dout of the semiconductor memory device. The access time is inversely proportional to the current driving capability as shown in FIG. 4. For example, a semiconductor memory device targets the access time of 100 nanosecond on the assumption of the capacitive load of 100 pF, the output data buffer unit 4b is expected to have the current driving capability of 12 milliamperes.

Since the geometries and the dopant concentration of a field effect transistor have influence on the current driving capability, the access time varies together with the channel width of each switching transistor 4f or 4g as shown in FIG. 5. For example, if the electrically programmable read only memory device targets the access time of 100 nanoseconds, each switching transistor 4f or 4g is designed to have the channel width at 300 microns. However, the channel width tends to vary due to fluctuation of process parameters, and the current driving capability of the output data buffer unit 4b can not be expected to achieve the target current driving capability.

On the other hand, customer's design specifications does not requests the maximum access time at all times A customer may request the maximum access time, but an electrically programmable read only memory device with longer access time can satisfy another customer For this reason, the manufacturer classifies the products as shown in FIG. 6. In the fabrication process of the electrically programmable read only memory device, a diffusion stage is repeated for forming impurity regions of circuit components as by step STP1 and STP2, and one of the diffusion stage is directed to the dopant concentration of the channels incorporated in the floating gate type field effect transistors. Though not shown in FIG. 6, the process sequence contains lithographic stages for patterning the gate electrodes of the switching transistors 4f and 4g, and the diffusion stage and the lithographic stages determine the current driving capability of the output data buffer unit 4b. Fluctuation is not avoidable, and the manufacturer checks the access time of the products upon completion of the fabrication process as by step STP3. Then, the manufacturer classifies the products depending upon the access time as by step STP4. If the products have the access times such as 90 nanoseconds, 100 nanoseconds, 110 nanoseconds and longer than 110 nanosecond, the products are classified to different groups. The products with the access time over 110 nanoseconds are discarded as defective product as by step 5, and the manufacturer writes the access times in non-volatile memory units other products as by step STP6. The manufacturer diagnoses the other products as by step STP7, and seals the semiconductor chips into packages. When a customer offers a purchase order to the manufacturer, the manufacturer delivers appropriate electrically programmable read only memory devices from his warehouse as by step STP8. Thus, the products has been classified depending upon the access time, and is desirable for quick delivery 2

However, a problem is encountered in the prior art electrically programmable read only memory device in that the yield of each grade is not controllable by the manufacture. Namely, the products are automatically classified depending upon the access time, and the manufacturer can not control the yield of the grade. If all the customer's design specifications request the highest grade, the manufacturer cannot quickly deliver the products due to shortage of the products classified to the highest grade.

SUMMARY OF THE INVENTION

It is therefore an important object of the present invention to provide a semiconductor memory device which is improved in current driving capability after completion of a fabricating process.

To accomplish the object, the present invention proposes to enable an auxiliary driving circuit for enhancing a current driving capability or to increase a voltage amplification capability of a sense amplifier circuit.

In accordance with one aspect of the present invention, there is provided a semiconductor memory device comprising: a) a memory cell array having a plurality of non-volatile memory cells each addressable with an address signal; b) an addressing means associated with the memory cell array for allowing an external device to selectively access data information stored in the non-volatile memory cells indicated by the address signal; c) a data transferring means coupled between an output data port and the memory cell array, and having a main output data buffer circuit originally installed in the data transferring means and driving an external load coupled with the output data port for supplying the accessed data information to an external device, and an auxiliary output data buffer circuit enabled with an internal enable signal for driving the external load together with the main output data buffer circuit; and d) a non-volatile memory means for storing an external control data signal indicative of activation of the auxiliary output data buffer circuit after completion of a fabrication process of the semiconductor memory device, and operative to produce the internal enable signal while storing the control data signal In accordance with another aspect of the present invention, there is provided a semiconductor memory device comprising: a) a memory cell array having a plurality of non-volatile memory cells each addressable with an address signal; b) an addressing means associated with the memory cell array for allowing an external device to selectively access data information stored in the non-volatile memory cells indicated by the address signal; c) a data transferring means coupled between an output data port and the memory cell array, and having c-1) a sense amplifier circuit supplying current to the memory cell array for quickly producing a voltage signal indicative of the accessed data information, and responsive to an internal control signal for changing a voltage amplification thereof, and c-2) an output data buffer circuit responsive to the voltage signal for driving an external load coupled with the output data port for supplying the accessed data information to an external device; and d) a non-volatile memory means for storing a control data signal supplied from the outside of the semiconductor memory device, and operative to produce the internal control signal while storing the control data signal

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
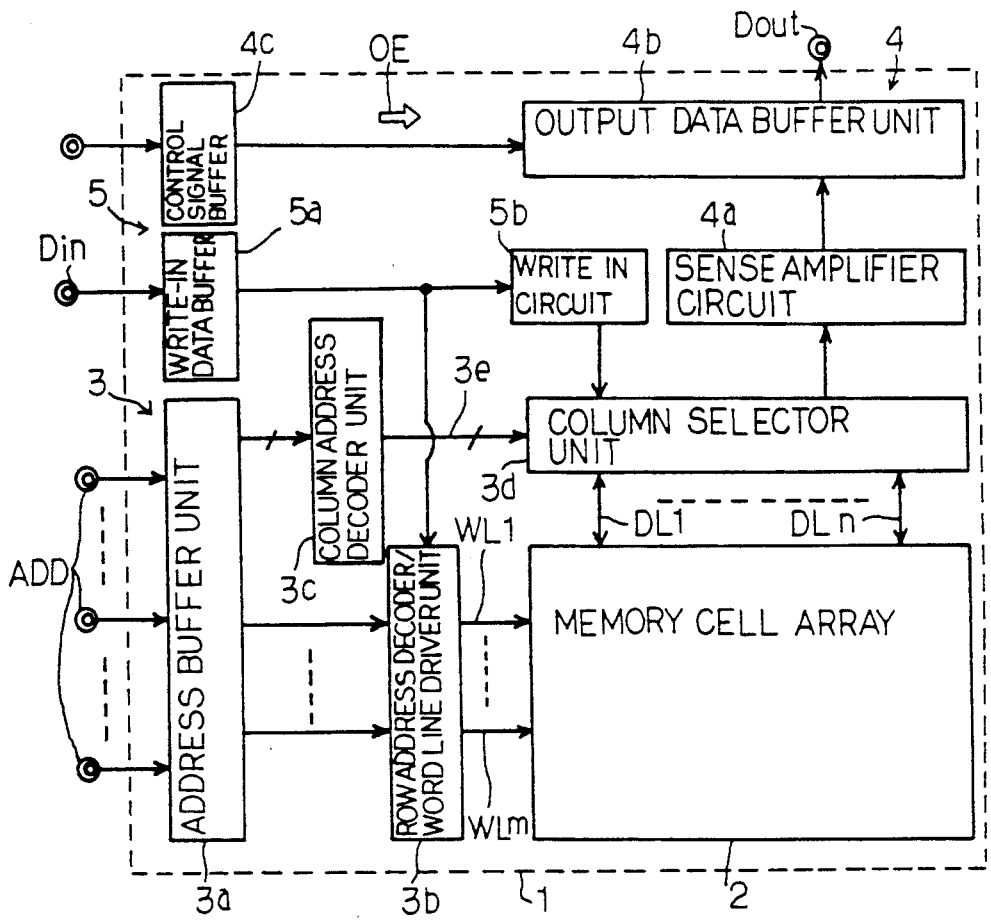
FIG. 1 is a block diagram showing the arrangement of the prior art electrically programmable read only memory device.
Figure 3:
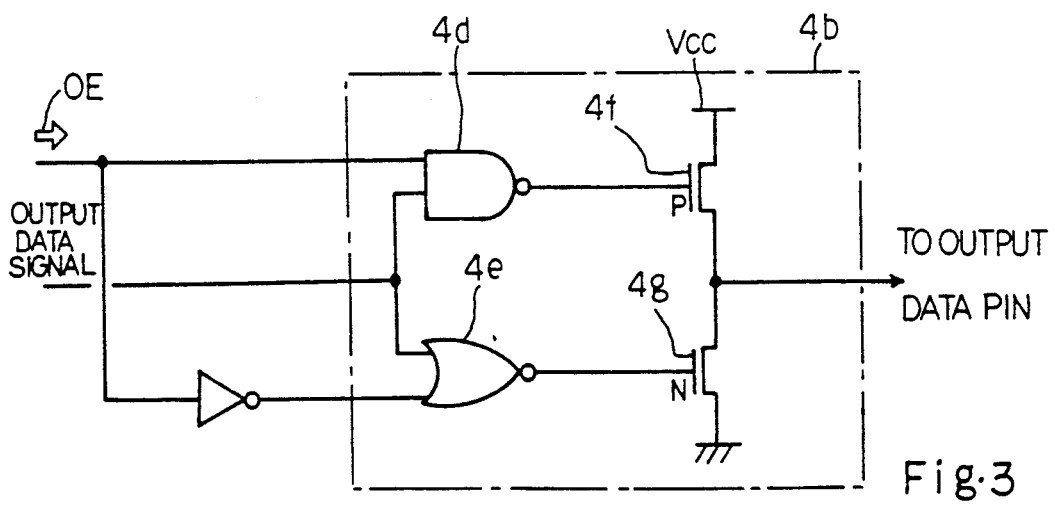
FIG. 3 is a circuit diagram showing the arrangement of the output data buffer unit incorporated in the prior art electrically programmable read only memory device.
Figure 2:
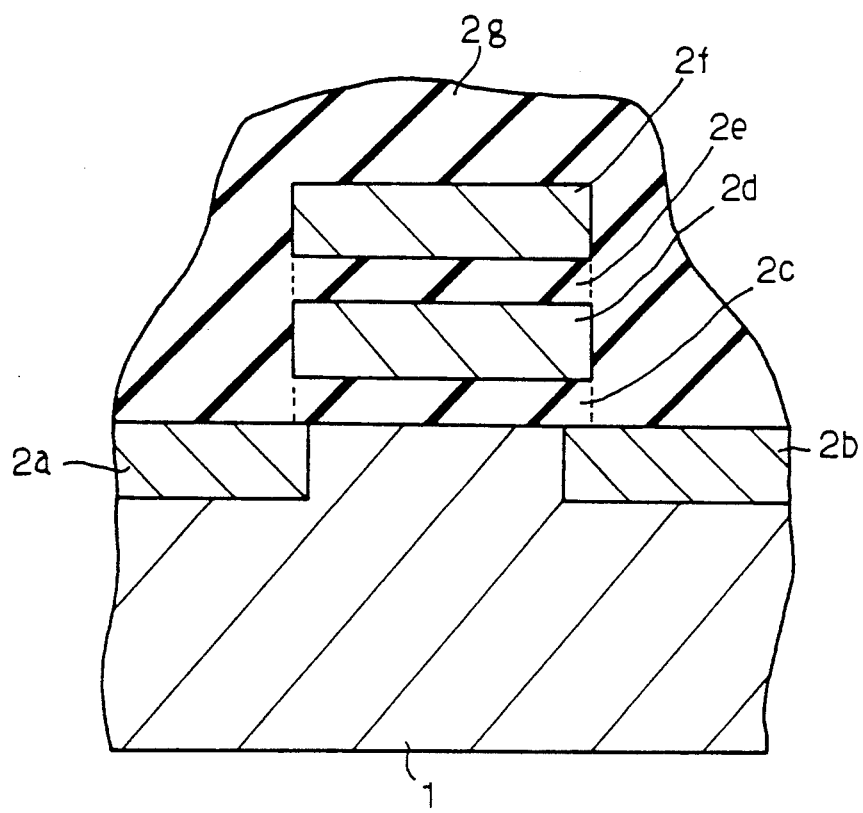
FIG. 2 is a cross sectional view showing the floating gate type field effect transistor.
Figure 4:
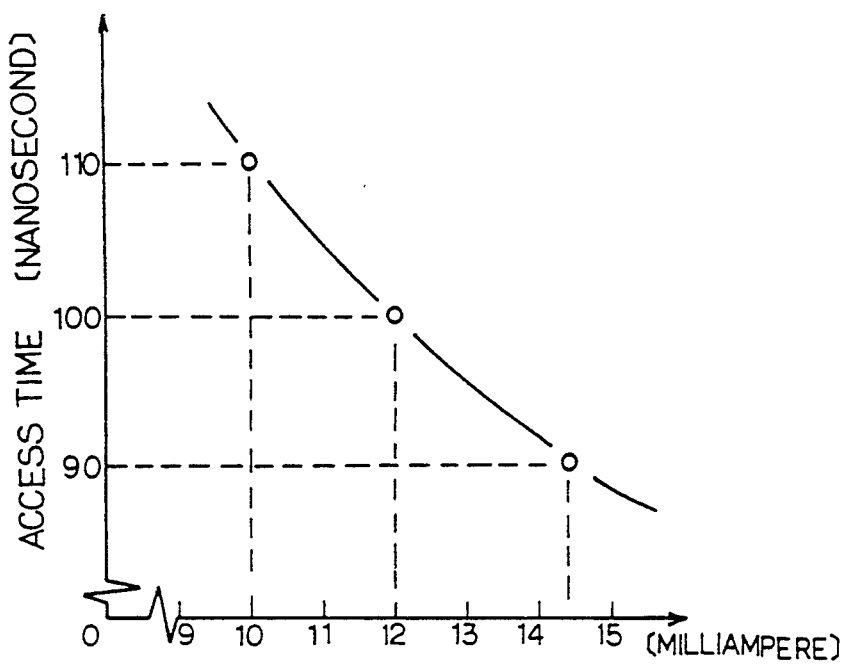
FIG. 4 is a graph showing relation access time to a data bit stored in an electrically programmable read only memory device in terms of the current driving capability of a field effect transistor forming a part of an data output buffer.
Figure 7:
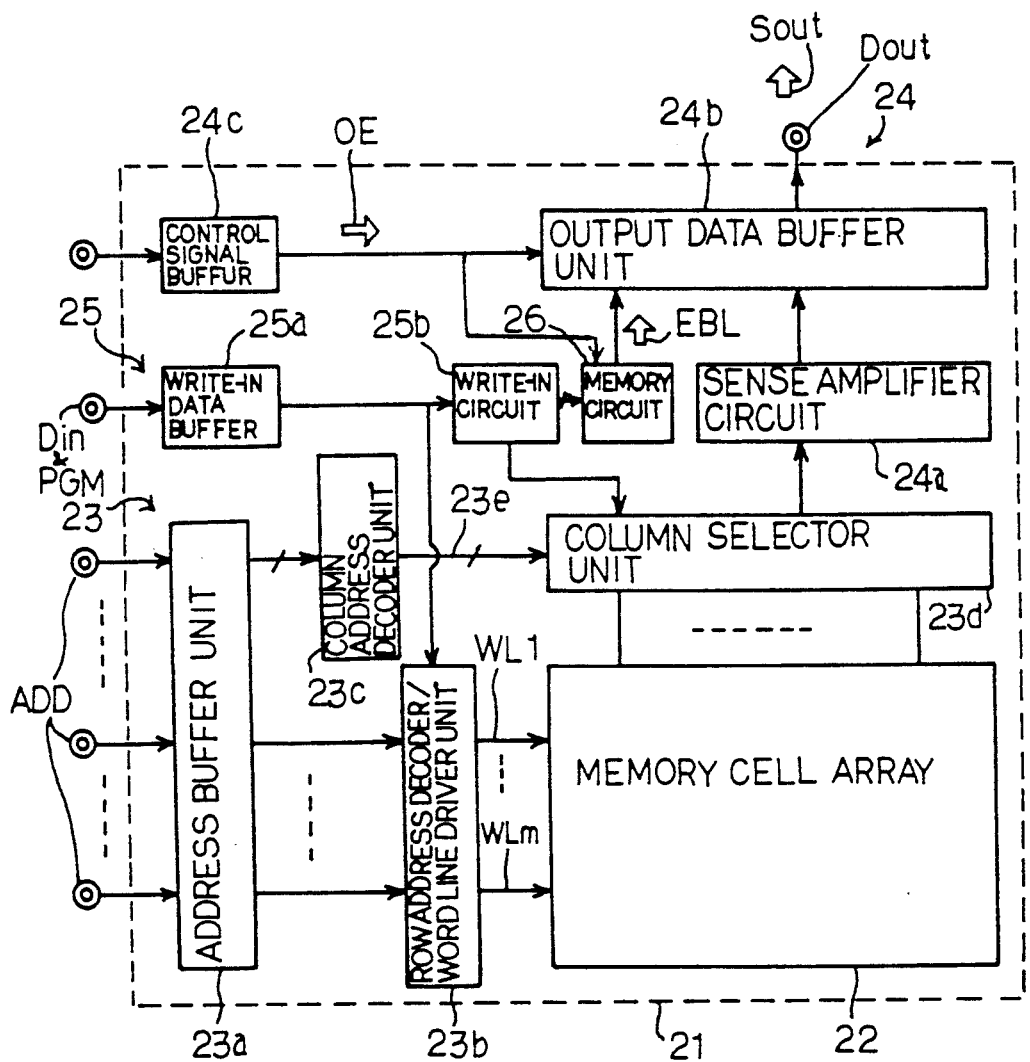
FIG. 7 is a block diagram showing the arrangement of an electrically programmable read only memory device according to the present invention.

Referring first to FIG. 7 of the drawings, an electrically programmable read only memory device embodying the present invention is fabricated on a semiconductor chip 21, and largely comprises a memory cell array 22, an addressing system 23, a data transferring system 24, a data write-in system 25 and a non-volatile memory circuit 26. As similar to FIG. 1, other systems such as a power distribution system are deleted from FIG. 7 for the sake of simplicity. The electrically programmable read only memory device selectively enters an erasing mode with radiation of ultra-violet light, a programming mode with a write-in voltage level of 12.5 volts, a read-out mode with a read-out voltage of 5 volts and a modifying mode. The addressing system 23 and the write-in system 25 achieve the write-in mode of operation, and the addressing system 23 and the data transferring system 24 supports the read-out mode of operation.

The memory cell array 22 is implemented by a plurality of non-volatile memory cells arranged in rows and columns, and each of the non-volatile memory cells are accessible with a row address and a column address. Each of the non-volatile memory cells is implemented by a floating gate type field effect transistor, and a data bit is stored as either high or low threshold In this instance, a data bit is indicative of data information. However, a concurrently accessible bit string may be indicative of data information.

The addressing system 23 comprises an address buffer unit 23a, a row address decoder/ word line driver unit 23b, a column address decoder unit 23c and a column selector unit 23d. The address buffer unit 23a is coupled with address pins ADD, and row address bits indicative of a row address and column address bits indicative of the column address are transferred from the address pins ADD to the address buffer unit 23a. The address buffer unit 23a predecodes the row and column address bits, and supplies the row address bits and the complementary row address bits to the row address decoder/ word line driver unit 23b and the column address bits and the complementary column address bits to the column address decoder unit 23c. The row address decoder/ word line driver unit 23b recognizes the row address, and drives one of the word lines WL1 to WLm coupled with the control gate electrodes of the row of the floating gate type field effect transistors assigned the row address. While the word line is driven by the row address decoder/ word line driver unit 3b in the read-out mode of operation, the non-volatile memory cells selectively produce conductive channels between digit lines DL1 to DLn and a constant voltage line (not shown) depending upon the threshold levels thereof As will be described hereinbelow, current is supplied to one of the digit lines DL1 to DLn, and a selected non-volatile memory cell keeps the voltage level on the selected digit line constant or varies the voltage level by discharging the current therethrough.

On the other hand, the column address decoder unit 23c selectively drives decoded signal lines 23e, and controls the column selector unit 23d. Namely, the column selector unit 23d is responsive to the column address decoded signal on the decoded signal lines 23e, and supplies the current to one of the digit lines DL1 to DLn coupled with the column of non-volatile memory cells assigned the column address.

The data transferring system 24 comprises a sense amplifier circuit 24a, an output data buffer unit 24b and a signal buffer circuit 24c, and produces an output data signal Sout through discrimination of the threshold level of the selected non-volatile memory cell. Namely, the sense amplifier circuit 24a supplies the current through the column selector unit 23d to the selected digit line, and monitors the voltage level on the selected digit line. If the selected non-volatile memory cell cuts off the current, the voltage level on the associated digit line is relatively high. However, if the selected non-volatile memory cell discharges the current to the constant voltage line, the voltage level is decayed, and is, accordingly, relatively low The sense amplifier circuit 24a discriminates the voltage level propagated from the selected digit line thereto, and produces the output data signal Sout. The output data signal Sout is supplied to the output data buffer unit 24b, and the output data buffer unit 24b in turn supplies the output data signal Sout to a destination in the presence of an output enable signal OE supplied from the control signal buffer circuit 24c.

The data write-in system 25 comprises a write-in data buffer circuit 25a and a write-in circuit 25b, and a write-in data bit indicative of either high or low threshold level is supplied from an input data pin Din through the write-in data buffer circuit 25a to the write-in circuit 25b in the programming mode of operation. If the write-in data bit is indicative of the low threshold level, the write-in circuit 25b does not supply the write-in voltage level to a selected non-volatile memory cell, and no hot electron is produced at the p-n junction Therefore, any electron is not accumulated in the floating gate electrode of the selected non-volatile memory cell, and the selected non-volatile memory cell keeps the relatively low threshold. However, if the write-in data bit is indicative of the high threshold level, the write-in circuit 25b supplies the write-in voltage level through the column selector unit 23d to the selected digit line, and the word line driver causes the control gate electrode of the selected non-volatile memory cell to go up to the high voltage level. The write-in voltage level produces the hot electrons, and the control gate electrode causes the floating gate electrode to accumulate the hot electrons. A programmer sequentially changes the row and column address bits, and instructs the write-in circuit 25b to selectively apply the write-in voltage. In the modifying mode, the write-in data buffer circuit 25a transfers a control data bit PGM to the write-in circuit 25b, and the write-in circuit 25b writes a bit of control information into the non-volatile memory circuit 26 for increasing the current driving capability of the output data buffer unit 24b. The non-volatile memory circuit 26 produces an internal enable signal EBL on the basis of the bit of control information, and the internal control signal EBL is supplied from the non-volatile memory circuit 26 to the output data buffer unit 24b. An operational sequence in the modifying mode will be described hereinlater in detail.

Figure 8:
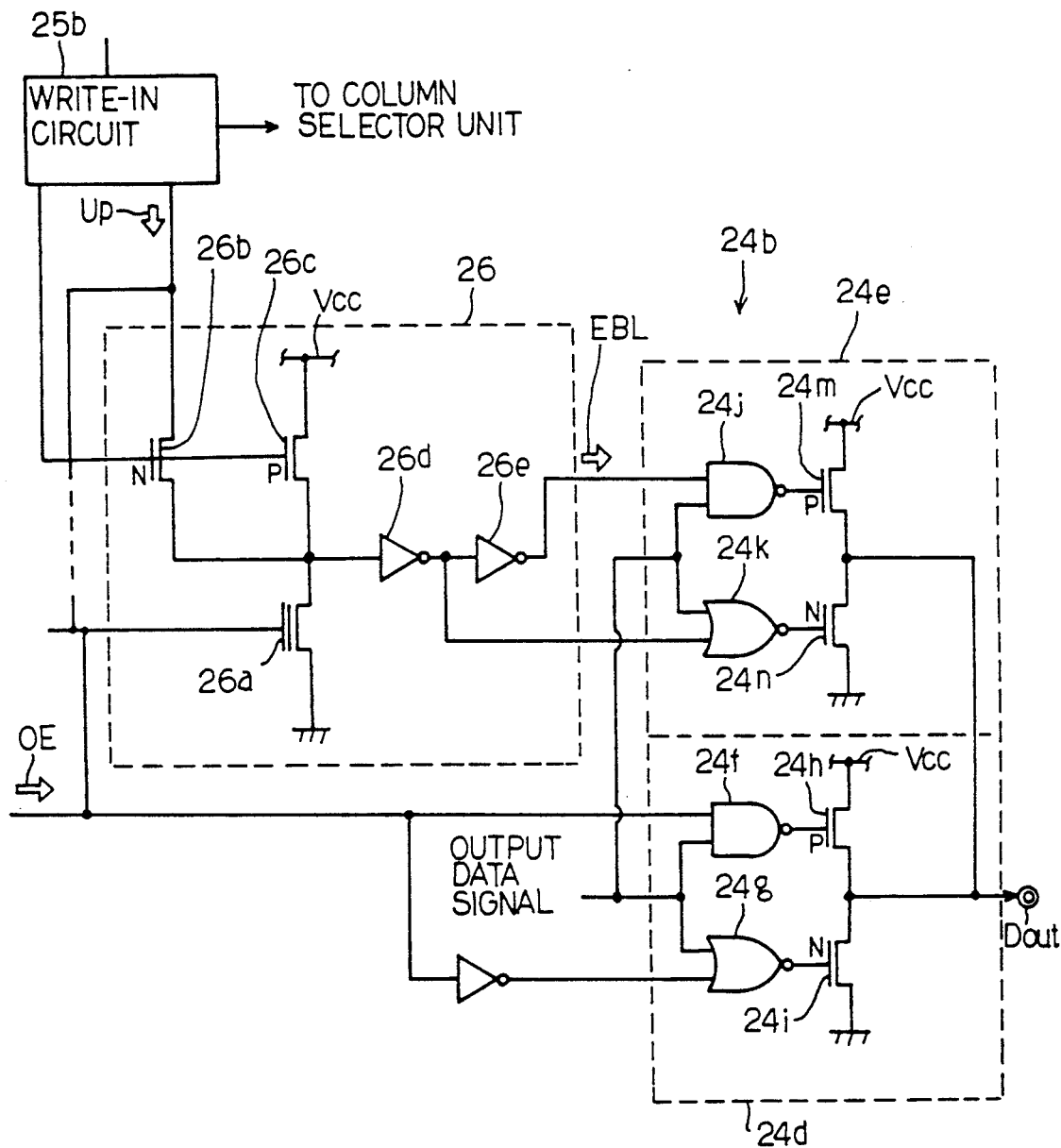
FIG. 8 is a circuit diagram showing the circuit arrangement of an output buffer unit and a non-volatile memory circuit incorporated in the electrically programmable read only memory device.

Turning to FIG. 8 of the drawings, the output data buffer unit 24b largely comprises a main output data buffer circuit 24d and an auxiliary output data buffer circuit 24e. The main output data buffer circuit 24d comprises a NAND gate 24f, a NOR gate 24g and a series combination of a p-channel enhancement type switching transistor 24h and an n-channel enhancement type switching transistor 24i coupled between a positive power voltage line Vcc and a ground voltage line. The auxiliary output data buffer circuit 24e is similar to the main output data buffer circuit 24d, and comprises a NAND gate 24j, a NOR gate 24k and a series combination of a p-channel enhancement type switching transistor 24m and an n-channel enhancement type switching transistor 24n coupled between a positive power voltage line Vcc and a ground voltage line. The output enable signal OE and the complementary signal thereof are supplied to the NAND gate 24f and the NOR gate 24g, and simultaneously enable the NAND gate 24f and the NOR gate 24g so as to make the gates 24f and 24g responsive to the output data signal. The output node of the NAND gate 24f is coupled with the gate electrode of the p-channel enhancement type switching transistor 24h, and the output node of the NOR gate 24g is coupled with the gate electrode of the n-channel enhancement type switching transistor 24i. While being enabled with the output enable signal OE and the complementary signal thereof, the NAND gate 24f and the NOR gate 24g serve as inverters, and complementarily switch the p-channel enhancement type switching transistor 24 h and the n channel enhancement type switching transistor 24i. In this instance, the p-channel enhancement type field effect transistor 24h and the n-channel enhancement type field effect transistor 24i are 300 microns in channel width.

The auxiliary output data circuit 24e is enabled with the internal enable signal EBL, and becomes responsive to the output data signal. Namely, the internal enable signal EBL and the complementary signal thereof are supplied to the NAND gate 24j and the NOR gate 24k, and simultaneously enable the NAND gate 24j and the NOR gate 24k so as to make the gates 24j and 24k responsive to the output data signal. The output node of the NAND gate 24j is coupled with the gate electrode of the p-channel enhancement type switching transistor 24m, and the output node of the NOR gate 24k is coupled with the gate electrode of the n-channel enhancement type switching transistor 24n. While being enabled with the internal enable signal EBL and the complementary signal thereof, the NAND gate 24j and the NOR gate 24k serve as inverters, and complementarily switch the p-channel enhancement type switching transistor 24m and the n-channel enhancement type switching transistor 24n. The p-channel enhancement type filed effect transistor 24m and the n-channel enhancement type field effect transistor 24n are 100 microns in channel width, and, accordingly, the auxiliary output data buffer circuit 24e is smaller in current driving capability than the main output data buffer circuit 24d.

The non-volatile memory circuit 26 thus producing the internal enable signal EBL comprises an n-channel floating gate type memory transistor 26a, an n-channel enhancement type transfer transistor 26b, a p-channel enhancement type load transistor 26c and inverters 26d and 26e. The n-channel floating gate type memory transistor 26a is identical in structure with the floating gate type field effect transistors serving as the memory cells. The n-channel enhancement type transfer transistor 26b and the p-channel enhancement type load transistor 26c are gated by the write-in circuit 25b, and the control gate electrode of the n-channel floating gate type memory transistor 26a is selectively coupled with the output signal buffer circuit 24c and the write-in circuit 25b. Namely, if the electrically programmable read only memory device enters the modifying mode in response to the control data bit PGM, the write-in circuit 25b supplies a programming voltage Vp of 12.5 volts to the gate electrode of the n-channel enhancement type transfer transistor 26b, the gate electrode of the p-channel enhancement type load transistor 26c and the control gate of the n-channel floating gate type memory transistor 26a. The p-channel enhancement type load transistor 26c turns off, and the n-channel enhancement type transfer transistor 26b turns on so as to transfers the programming voltage Vp to the drain node of the n-channel floating gate type memory transistor 26a. Then, hot electrons take place at the p-n junction between the drain region and the semiconductor substrate 21, and are injected into the floating gate electrode of the n-channel floating gate type memory transistor 26a. As a result, the threshold level is elevated to 7 volts. However, if the floating gate electrode does not accumulate any electron, the threshold of the n-channel floating gate type memory transistor 26a remains in 1 volt.

While the electrically programmable read only memory device stays in the read-out mode, the write-in circuit changes the voltage level at the gate electrode of the transfer transistor 26b and the gate electrode of the load transistor 26c to the ground voltage level, and the n-channel enhancement type transfer transistor 26b is turned off, and the p-channel enhancement type load transistor 26c turns on so as to couple the positive power voltage line Vcc with the drain node of the n-channel floating gate type memory transistor 26a. The output enable signal OE is supplied to the control gate electrode of the n-channel floating gate type memory transistor 26a, and the n-channel floating gate type memory transistor 26a provides or cuts off a conductive channel depending upon the threshold level. If the threshold level is high, the drain node keeps at the high voltage level, and inverters 26e and 26d produce the internal enable signal EBL and the complementary signal thereof, respectively. However, the low threshold level allows the n-channel floating gate type memory transistor 26a to turn on, and the inverters 26d and 26e disable the NAND gate 24j and the NOR gate 24k. Thus, the non-volatile memory circuit 26 is responsive to the control data bit PGM, and enables or disables the auxiliary output data buffer circuit 24e.

Figure 5:
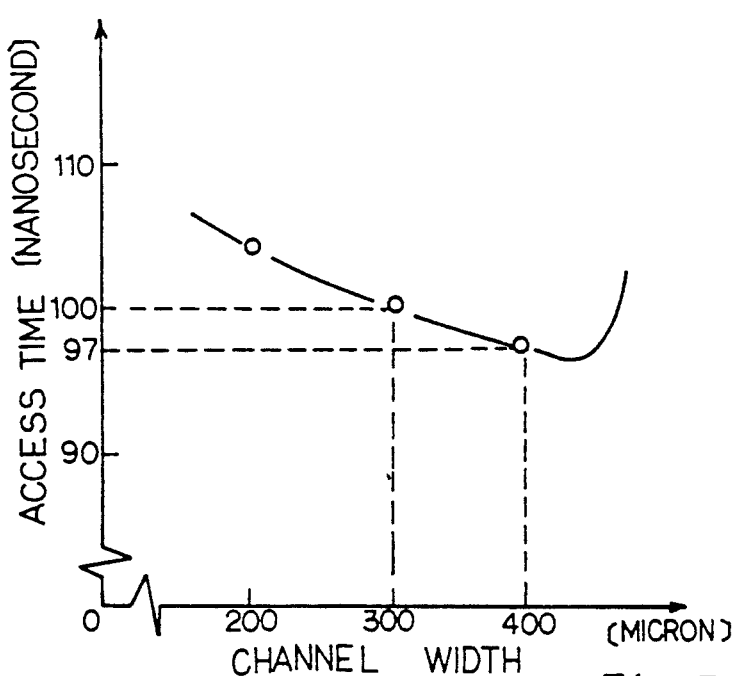
FIG. 5 is a graph showing access time in terms of a channel width of the field effect transistor.
Figure 6:
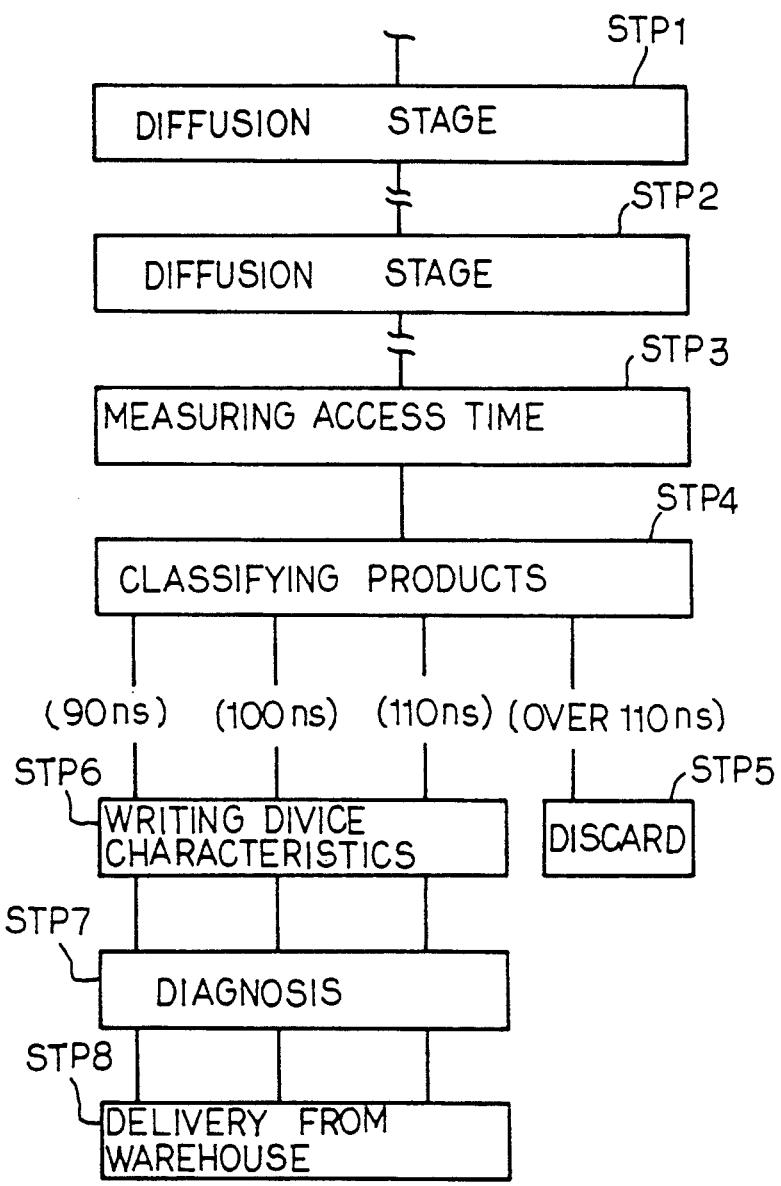
FIG. 6 is a flow chart showing the part of the fabrication process for the prior art electrically programmable read only memory device.

If the non-volatile memory circuit 26 disables the auxiliary output data buffer circuit 24e, the output data buffer unit 24b behaves as similar to that of the prior art electrically programmable read only memory device. However, if the threshold level of the n-channel floating gate type memory transistor 26a is increased through the modifying mode of operation, both main and auxiliary output data buffer circuits 24d and 24e drive a capacitive load coupled with the output data pin Dout. The main and auxiliary output data buffer circuits 24d and 24e are equivalent to an output data buffer circuit with the channel width as wide as 400 microns, and the access time is decreased by 3 nanoseconds as will be understood from FIG. 5. This means that a product with access time of 113 nanoseconds is rescued by using the auxiliary output data buffer circuit 24e.

Figure 9:
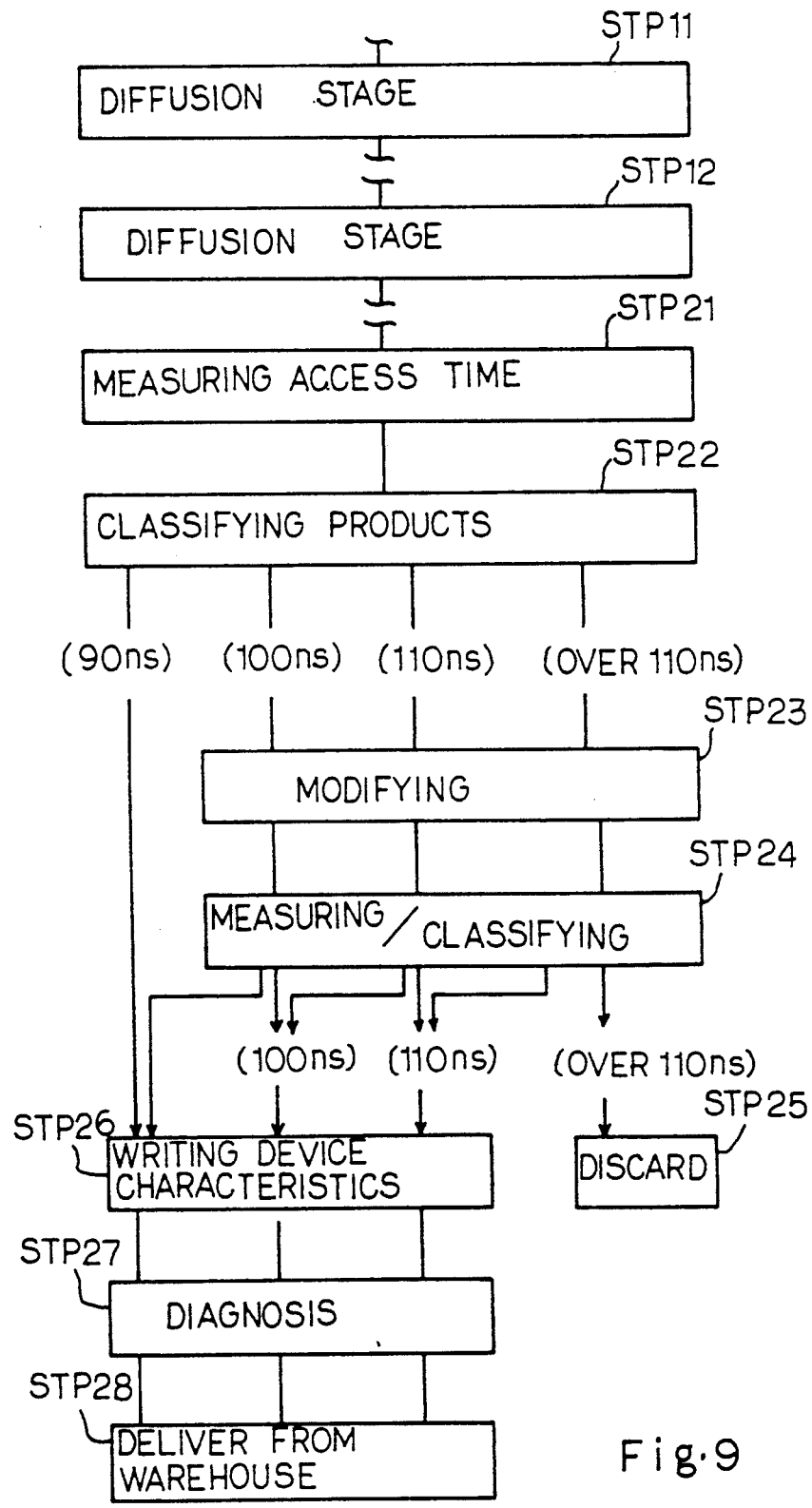
FIG. 9 is a flow chart showing a sequence of grading process for the electrically programmable read only memory device.

Description is hereinbelow made on a grading process sequence with reference to FIG. 9. The grading sequence starts upon completion of a fabrication process including diffusion stages STP11 and STP12 and patterning stages. Firstly, the access time of each product is measured as by step STP21, and the manufacturer classifies the products into, for example, the highest grade products with access time of 90 nanoseconds, higher grade products with access time of 100 nanoseconds, medium grade products with access time of 110 nanoseconds and poor grade products with access time over 110 nanoseconds as by step STP22.

The higher grade products to the poor grade products are subjected to the modifying operation, and the n-channel floating gate type memory transistors 26a enter the programmed state through the modifying operation as by step STP23. As a result, the higher grade products to the poor grade products are improved in current driving capability. The manufacturer measures the access time again, and classifies the products again as by step STP24. Most of the higher grade products to the poor grade products may be classified into the highest grade to the medium grade. However, the remaining products are classified to the poor grade again. Such poor grade products are discarded as by step STP25. However, device characteristics such as the access time are written into the other products as by step STP26, and the other products are subjected to diagnosis for screening out defective products as by step STP27. If the products are excellent, the manufacturer seals the semiconductor chips into packages, and stores the electrically programmable read only memory devices in a warehouse. When a customer offers a purchase order to the manufacturer, the manufacturer delivers appropriate electrically programmable read only memory devices from the warehouse as by step STP28.

As will be appreciated from the foregoing description, the non-volatile semiconductor memory device according to the present invention changes the current driving capability through the modifying operation, and are allowed to be ranked higher grade. According to the present invention, the current driving capability is increased by using the auxiliary output data buffer circuit 24e, and the auxiliary output data buffer circuit 24e is free from malfunction.

Second Embodiment

Figure 10:
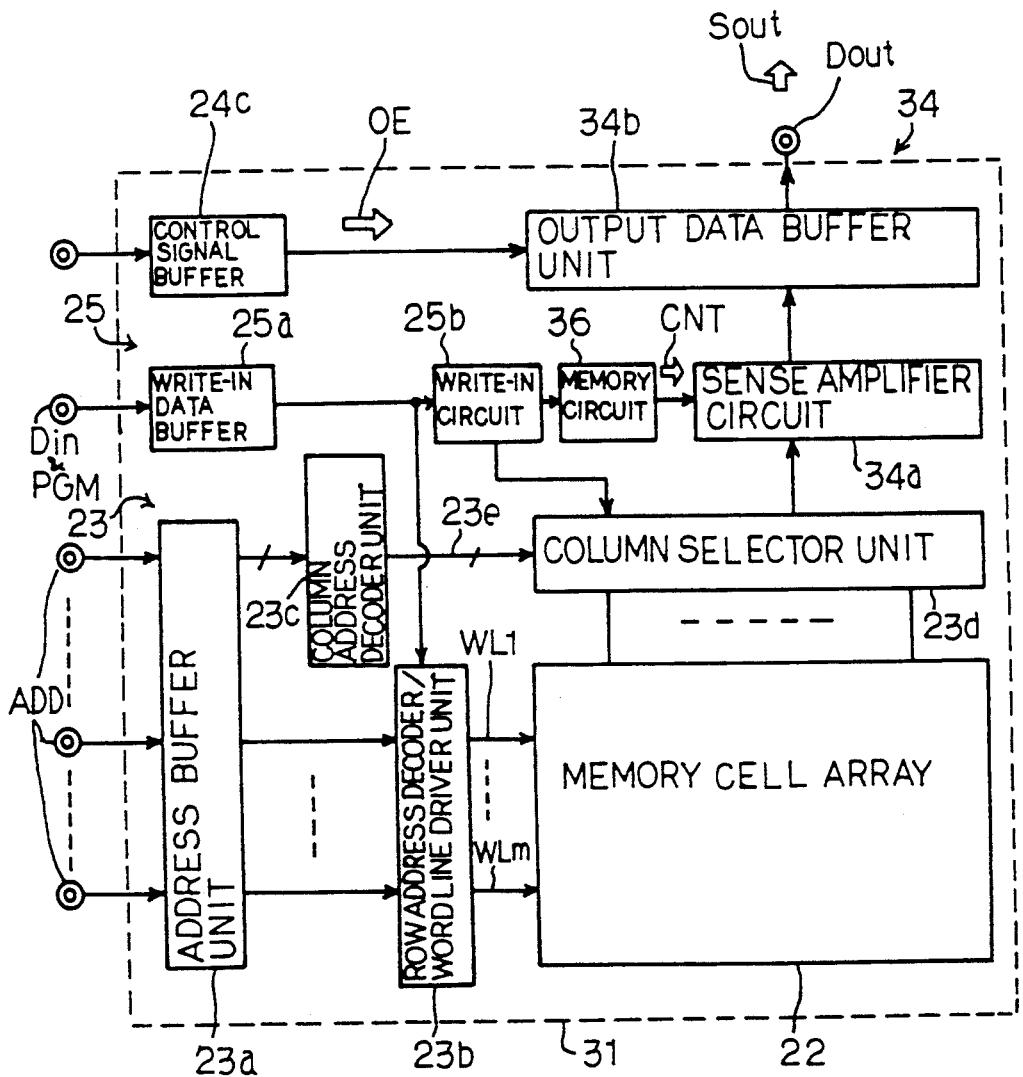
FIG. 10 is a block diagram showing the arrangement of another electrically programmable read only memory device according to the present invention.
Figure 11:
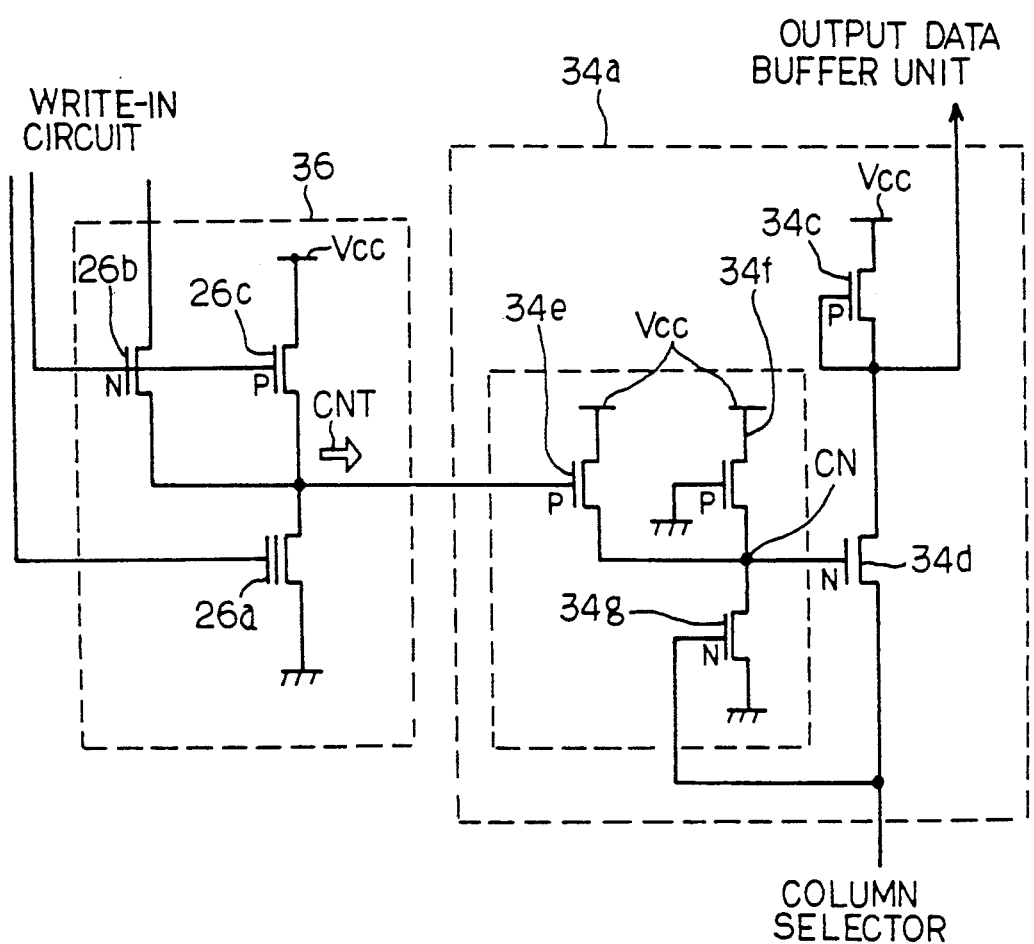
FIG. 11 is a circuit diagram showing the arrangement of a sense amplifier circuit and a non-volatile memory circuit incorporated in the electrically programmable read only memory device.

Turning to FIG. 10 of the drawings, another electrically programmable read only memory device is fabricated on a semiconductor chip 31, and is similar in arrangement to the first embodiment except for a sense amplifier circuit 34a, a non-volatile memory circuit 36 and an output data buffer unit 34b. The other component units are labeled with the same references designating corresponding units of the first embodiment without detailed description for avoiding repetition.

The output data buffer unit 34b is implemented by an output data buffer circuit only, and is similar to that of the prior art electrically programmable read only memory device. For this reason, the current driving capability of the output data buffer unit 34b is unchangeable.

The non-volatile memory circuit 36 is associated with the sense amplifier circuit 34a, and comprises the n-channel floating gate type memory transistor 26a, the n-channel enhancement type transfer transistor 26b and the p-channel enhancement type load transistor 26c. However the inverters 26d and 26e are not incorporated in the non-volatile memory circuit 36. The threshold of the n-channel floating gate type memory transistor 26a are changeable through the modifying operation. However, the positive voltage of 5 volts is applied to the control gate electrode of the n-channel floating gate type memory transistor 26a at all times in the read-out mode of operation. If the control data bit PGM is supplied to the write-in circuit 25b, the write-in circuit 25b causes the n-channel floating gate type memory transistor 26a to change the threshold level from 1 volt to 7 volts, and the non-volatile memory circuit 36 produces an internal control signal CNT at the drain node of the n-channel floating gate type memory transistor 26a.

The sense amplifier circuit comprises a series combination of a p-channel enhancement type load transistor 34c and an n-channel enhancement type switching transistor 34d coupled between the positive power voltage line Vcc and the column selector unit 23d, a parallel combination of p-channel enhancement type load transistors 34e and 34f coupled between the positive power voltage line Vcc and a control node CN, and an n-channel enhancement type discharging transistor 34g coupled between the control node CN and the ground voltage line. The p-channel enhancement type load transistor 34g has the gate electrode coupled with the ground voltage line, and, for this reason, supplies current to the control node CN at all times. On the other hand, the p-channel enhancement type load transistor 34e is responsive to the internal control signal CNT, and blocks the control node CN from the positive power voltage line Vcc. However, the p-channel enhancement type load transistor 34e supplies current to the control node CN in the absence of the internal control signal CNT. In this instance, the p-channel enhancement type load transistor 34e is 10 microns in channel width, and the other p-channel enhancement type load transistor 34f is 30 microns in channel width.

In the read-out operation, the n-channel enhancement type discharging transistor 34g keeps the control node CN high before the row address decoder/ word line driver unit 23b does not select any word line. For this reason, the n-channel enhancement type switching transistor 34d is turned on, and the positive power voltage line Vcc is conducted through the transistors 34c and 34d with the column selector unit 23d. If one of the word lines WL1 to WLm and one of the digit lines are selected, current flows into the selected digit line, and the selected memory cell either discharges or cuts off the current depending upon the threshold thereof. If the threshold is low, the current is discharged, and the n-channel enhancement type discharging transistor 34g keeps off. As a result, the n-channel enhancement type switching transistor 34d continuously allows the current to pass therethrough, and the output data signal of low voltage level is produced at the drain node of the p-channel enhancement type load transistor 34c.

On the other hand, if the selected memory cell cuts off the current, the voltage level on the selected digit line is increased, and the n-channel enhancement type discharging transistor 34g turns on. As a result, the control node CN is decayed, and the n-channel enhancement type switching transistor 34d turns off. Then, the output data signal is changed to the high voltage level.

If a memory cell with the low threshold is subsequently accessed, the voltage level on the selected digit line is decayed, and the n-channel enhancement type discharging transistor 34g turns off. The p-channel enhancement type load transistors 34e and 34f supply current to the control node CN, and the n-channel enhancement type switching transistor 34d turns on for changing the output data signal to the low voltage level.

Figure 12:
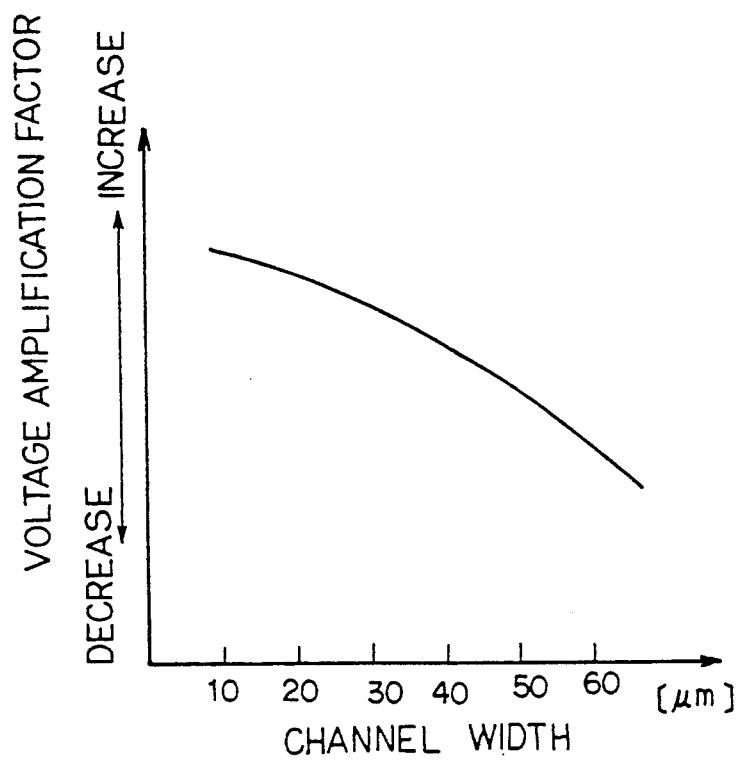
FIG. 12 is a graph showing the voltage amplification factor in terms of the channel width of load transistors.

Thus, the alternation of logic level is depending upon the switching action of the transistor 34d, and the switching action in turn is dependent on the current driving capability of the p-channel enhancement type load transistors 34e and 34f. If a voltage amplification factor dV is defined as $$dV = dVOUT/dVIN$$

where dVOUT is variation of the voltage level of the output data signal and dVIN is variation of the voltage level on the selected digit line. The access time is variable with the voltage amplification factor of the sense amplifier circuit 34a, and the voltage amplification factor is dependent on the channel width of the load transistors 34e and 34f as shown in FIG. 12. If the total current driving capability of the p-channel enhancement type load transistors 34e and 34f is smaller than the current driving capability of the n-channel enhancement type discharging transistor 34g, the voltage amplification factor becomes larger. The internal control signal CNT allows the p-channel enhancement type load transistor 34e to turn off, and the equivalent channel width is decreased so that the voltage amplification factor is increased. Therefore, the access time is improved by closing the p-channel enhancement type load transistor 34e, and the access time is regulable after completion of a fabrication process.

Although particular embodiments of the present invention have been shown and described, it will be obvious to those skilled in the art that various changes and modifications may be made without departing from the spirit and scope of the present invention. For example, the present invention may appertain to an electrically erasable and programmable read only memory device.

What is claimed is:

1. A semiconductor memory device comprising:
   a) a memory cell array having a plurality of non-volatile memory cells each addressable with an address signal;
   b) an addressing means associated with said memory cell array for allowing an external device to selectively access data information stored in said non-volatile memory cells indicated by said address signal;
   c) a data transferring means coupled between an output data port and said memory cell array, and having a main output data buffer circuit originally installed in said data transferring means and driving an external load coupled with said output data port for supplying the accessed data information to an external device, and an auxiliary output data buffer circuit enabled with an internal enable signal for driving said external load together with said main output data buffer circuit; and
   d) a non-volatile memory means for storing an external control data signal indicative of activation of said auxiliary output data buffer circuit after completion of a fabrication process of said semiconductor memory device, and operative to produce said internal enable signal while storing said control data signal.

2. A semiconductor memory device as set forth in claim 1, in which said main output data buffer circuit comprises a complementary inverter implemented by a series combination of a first enhancement type switching transistor of one channel conductivity type and a second enhancement type switching transistor of the opposite channel conductivity type coupled between a first power voltage line and a second power voltage line, a first logic gate enabled with an output enable signal and responsive to an output data signal indicative of said accessed data information for controlling said first enhancement type switching transistor, and a second logic gate enabled with said output enable signal and responsive to said output data signal for controlling said second enhancement type switching transistor.

3. A semiconductor memory device as set forth in claim 2, in which said auxiliary output data buffer circuit comprises a complementary inverter implemented by a series combination of a third enhancement type switching transistor of said one channel conductivity type and a fourth enhancement type switching transistor of said opposite channel conductivity type coupled between said first power voltage line and said second power voltage line, a third logic gate enabled with said internal enable signal and responsive to said output data signal indicative of said accessed data information for controlling said third enhancement type switching transistor, and a fourth logic gate enabled with said internal enable signal and responsive to said output data signal for controlling said fourth enhancement type switching transistor, said third and fourth enhancement type switching transistors being smaller in channel width than said first and second enhancement type switching transistors, respectively.

4. A semiconductor memory device as set forth in claim 3, in which said non-volatile memory means comprises an electrically programmable memory transistor coupled at a source node thereof with said second power voltage line and having a threshold level changeable with said external control data signal, a fifth enhancement type transfer transistor of said opposite channel conductivity type coupled between a source of write-in voltage and a drain node of said electrically programmable memory transistor and operative to couple said source of write-in voltage with said electrically programmable memory transistor in a modifying operation different from a read-out operation on said memory cell array, a sixth enhancement type load transistor of said one channel conductivity type coupled between said first power voltage line and said rain node and operative to couple said first power voltage line with said electrically programmable memory transistor in said read-out operation, and an internal enable signal producing circuit coupled with said drain node of said electrically programmable memory transistor and the gate electrodes of said third and fourth enhancement type switching transistors for supplying said internal enable signal consisting of two bits complementary to each other.

* * * * *

UNITED STATES PATENT AND TRADEMARK OFFICE
CERTIFICATE OF CORRECTION

PATENT NO. : 5,303,188
DATED : April 12, 1994
INVENTOR(S) : Kohno

It is certified that errors appears in the above-identified patent and that said Letters Patent is hereby corrected as shown below:

Column 2, line 5  after "is" insert -- driven by the row decoder/word line driver unit --

Column 7, line 22  after "low" insert -- . --.

Column 14, line 18  delete "rain" insert -- drain --

Signed and Sealed this

Thirtieth Day of May, 1995

Attest:

BRUCE LEHMAN

Attesting Officer    Commissioner of Patents and Trademarks